United States Patent

Metzger

[15] 3,681,664

[45] Aug. 1, 1972

[54] TRIMMER CAPACITOR FOR PRINTED CIRCUIT BOARD

[72] Inventor: Louis G. Metzger, Closter, N.J.

[73] Assignee: JFD Electronics Corp., Brooklyn, N.Y.

[22] Filed: Aug. 19, 1971

[21] Appl. No.: 173,134

[52] U.S. Cl.......317/101 C, 317/101 CC, 317/249 D, 29/25.42, 29/626

[51] Int. Cl.............................H01g 5/06, H02b 1/04

[58] Field of Search...317/101 C, 101 CC, 249 R, 249 D; 29/25.42, 626

[56] References Cited

UNITED STATES PATENTS 3,244,951 4/1966 Wallace....................317/249 D

*Primary Examiner*—E. A. Goldberg
*Attorney*—Sidney G. Faber et al.

[57] ABSTRACT

A trimmer capacitor having painted conductive leads is soldered directly to appropriate conductive sections of a printed circuit panel. A portion of the adjustment mechanism of the printed circuit board is disposed at least partly within an opening in the printed circuit board so that the trimmer capacitor has a minimum height above the upper surface of the printed circuit board. During manufacture, a lug is soldered to the printed circuit, which lug is to be connected to the rotor electrode, and the board is then cleaned of soldering flux. The stator of the capacitor is then soldered to the printed circuit board and the board is again rinsed clean of soldering flux. The rotor assembly is later mounted on the soldered stator assembly, and the rotor electrode is connected to the printed circuit board by a pressure connection to the lug. The sliding interface between the stator and rotor is not subjected to soldering fluxes, so as to not interfere with intimate seating and free sliding of these surfaces relative to one another.

11 Claims, 10 Drawing Figures

INVENTOR.
LOUIS G. METZGER
BY
Ostrolenk, Faber, Gerb & Soffen
ATTORNEYS

INVENTOR.
LOUIS G. METZGER
BY
Ostrolenk, Faber, Gerb & Soffen
ATTORNEYS

TRIMMER CAPACITOR FOR PRINTED CIRCUIT BOARD

RELATED APPLICATIONS

This application is related to my copending application Ser. No. 173,117, filed Aug. 19, 1971, entitled LOW HEIGHT CERAMIC CAPACITOR FOR PRINTED CIRCUIT BOARD MOUNTING, and is assigned to the assignee of the present invention.

BACKGROUND OF THE INVENTION

This invention relates to miniature trimmer capacitors, and more specifically relates to a novel structure and method of assembly for a trimmer capacitor which is mounted on a printed circuit board.

Miniature trimmer capacitors are well known, and provide a given range of capacitance adjustment with a relatively small volume device. One such trimmer capacitor, which can be modified in accordance with the present invention, is the trimmer capacitor shown in U.S. Pat. No. 3,244,951 to Wallace, entitled LAMINATED ROTOR STRUCTURE FOR VARIABLE CAPACITORS, and assigned to the assignee of the present invention. The device shown in the above noted patent is a complete capacitor device which is provided with extending leads connected to the rotor and stator electrodes, respectively, which enable the connection of the device in a particular circuit. Thus, if the device of the above-noted patent were to be used in connection with a printed circuit board arrangement, the entire device would be mounted on top of the printed circuit board, and its extending leads would be soldered into the printed circuit board configuration in the usual manner.

Many applications for electrical circuits requiring adjustment through the adjustment of a trimmer capacitor have such rigid space requirements that even miniaturized trimmer capacitors constructed in accordance with the above-noted Wallace patent would occupy too much height above the printed circuit board. Typical of such applications are wrist watch assemblies which are electrically operable and which contain a printed circuit board within a watch case wherein a trimmer capacitor is provided to enable the tuning of an oscillating circuit which, in turn, suitably adjusts the timing mechanism. In view of the design of the watch cases, it will be readily understood that the thickness of the printed circuit panel and the height of components atop the panel must be held to a minimum.

BRIEF DESCRIPTION OF THE INVENTION

In accordance with the present invention, a trimmer capacitor construction for a printed circuit is provided, wherein a portion of the mechanism which fixes the trimmer capacitor together is carried in an opening in the printed circuit panel. By following this type novel construction, the total height of the trimmer capacitor may be reduced by the thickness of the printed circuit panel board, which typically could be from one-sixteenth to one thirty-second of an inch, which is a size comparable to about half the height of a trimmer capacitor which can be used in any wrist watch or similar application. The height of said device is further reduced by the absence of a stator lead, which allows a still further reduction in height of the stator body.

As a further feature of the invention, the trimmer capacitor is adapted for use particularly with a printed circuit board, and accordingly is provided with only painted-on leads, as contrasted to conventional extending leads, where these painted-on leads are electrically connected by soldering to the appropriate conductive areas of a printed circuit panel. Moreover, the capacitor is assembled in such a manner that the sliding junction between the opposed surfaces of the rotor and the stator of the capacitor is not exposed to soldering fluxes or fumes created during the soldering of the stator to the panel and of the rotor connection to the panel.

DETAILED DESCRIPTION OF THE INVENTION

Figures 1, 2, 3, 4, 5, 6, 7:
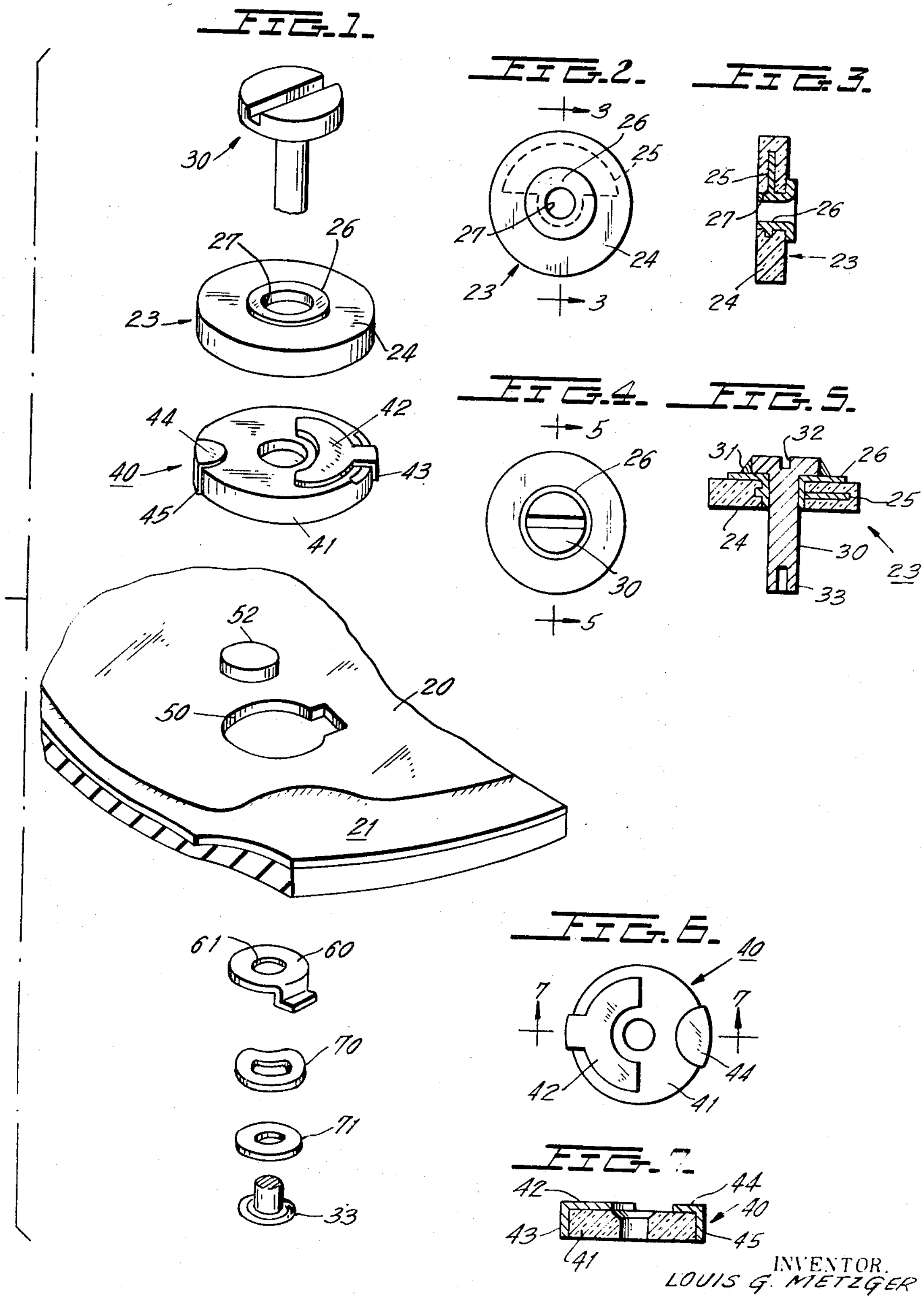
FIG. 1 is an exploded perspective view of the novel trimmer capacitor of the present invention in connection with a section of a printed circuit board which receives the capacitor.
FIG. 2 is a top plan view of the rotor of the trimmer capacitor of FIG. 1.
FIG. 3 is a cross-sectional view of FIG. 2 taken across the section lines 3—3 in FIG. 2.
FIG. 4 is a top plan view of the rotor of FIGS. 2 and 3 after the connection of the adjustment screw thereto.
FIG. 5 is a cross-sectional view of FIG. 4 taken across the section lines 5—5 in FIG. 4.
FIG. 6 is a top plan view of the stator of the trimmer capacitor of FIG. 1.
FIG. 7 is a cross-sectional view of FIG. 6 taken across the section lines 7—7 in FIG. 6.
Figure 8:
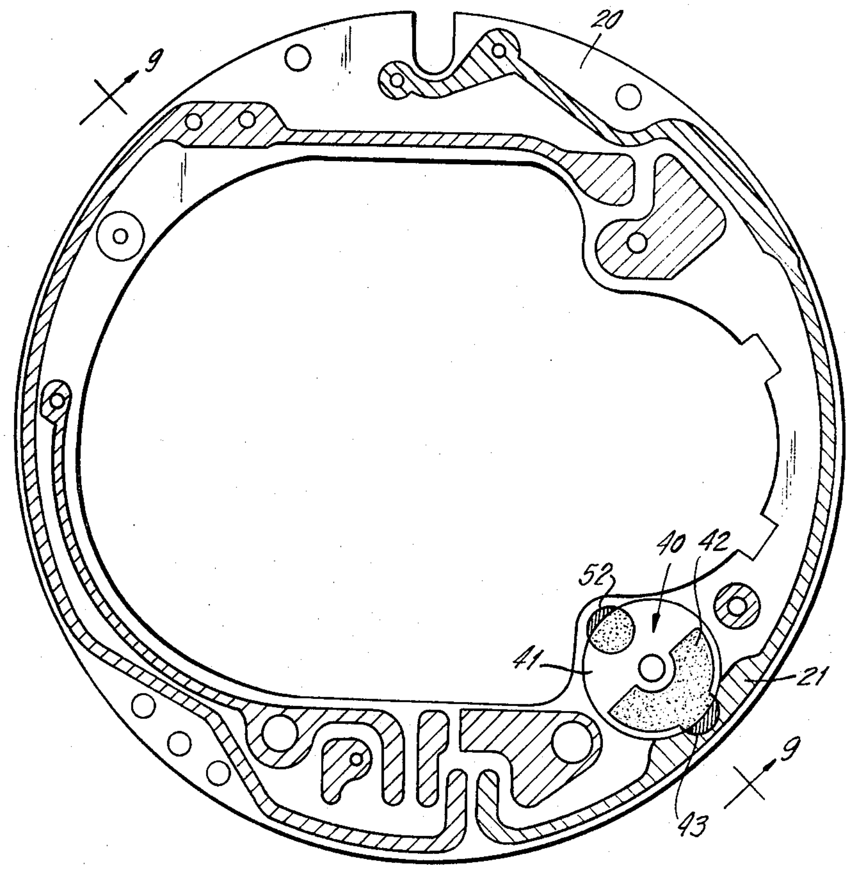
FIG. 8 is a top plan view of a typical printed circuit board to be used in connection with an electrically operable watch, and further illustrates the soldering of the stator of FIGS. 7 and 8 thereto.
Figure 9:
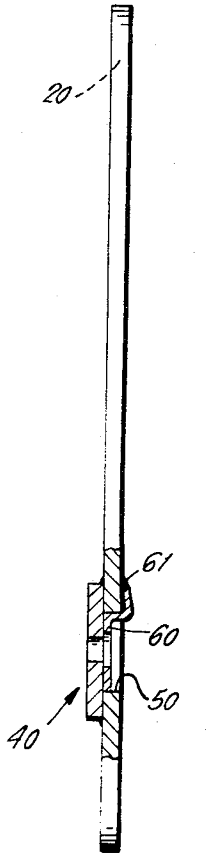
FIG. 9 is a cross-sectional view of FIG. 8 taken across the sections line 9—9 in FIG. 8.
Figure 10:
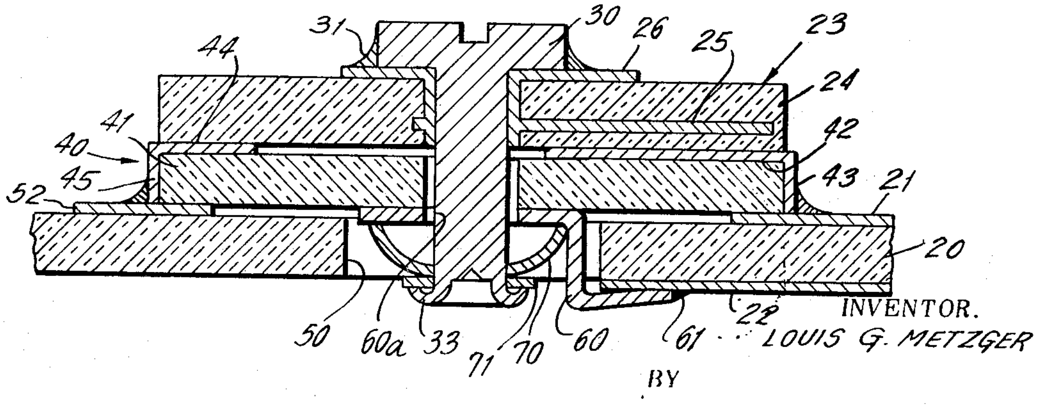
FIG. 10 is an enlarged cross-sectional view of the assembled trimmer capacitor and panel board of the foregoing figures.

Referring now to the figures, there is illustrated a typical printed circuit panel 20, best shown in FIG. 8 and additionally shown in FIGS. 1, 9 and 10, wherein the printed circuit panel has some desired conductive pattern placed on its top surface, seen in FIG. 8, and on its bottom surface as well, where this conductive pattern is used in the formation of a particular circuit. Thus, in FIGS. 1, 8 and 10, there is a conductive pattern section 21 which will be seen hereinafter to be connected to the stator electrode of a trimmer capacitor, while the bottom surface of the board 20 has a conductive section 22, shown in FIG. 10, which is to be connected to the rotor electrode. Note in FIGS. 8 and 9 that the printed circuit board 20 is circular in configuration so that it can match the configuration of a conventional circular watch case. The central portion of the board 20 is removed to allow space from the watch mechanism. Note that any suitable pattern could be provided for the printed circuit board, and further note that the invention, to be described hereinafter, may be used in connection with any type of printed circuit board configuration, where it is desired to have the trimmer capacitor component extend a minimum distance above the top of the board.

The rotor used in connection with the present invention is particularly shown in FIGS. 1, 2 and 3 as the rotor 23 and consists of a body of a suitable dielectric material 24 having embedded therein a conductive electrode 25 which has a generally semicircular shape, as shown in FIG. 2. Preferably, the electrode 25 will be much closer to one surface of the dielectric disk 24 than to the other surface so that it can provide a very small dielectric gap from the rotor electrode to the stator electrode, thereby to increase, as great as possible, the capacitance which can be obtained in a very small volume. In this regard, the construction of the rotor 23 may be identical to that described in the U.S. Pat. No. 3,224,951, referred to above, which discloses an embedded electrode construction. However, if desired, rotor 23 may have an enlarged external electrode in order to reduce maximum capacitance.

The terminal for the embedded electrode 25 is formed by the conductive layer 26 which extends from the interior of central opening 27 of dielectric disk 24 to a region on the top of the dielectric disk 24. The layer 26 permits adequate space for electrical connection of the rotor electrode to an adjustment shaft 30, as shown in FIGS. 4 and 5, wherein the head of adjustment shaft 30 is soldered to the conductive layer 26 by the solder layer 31 (FIG. 5) so that the adjustment shaft and rotor are subassembled into a unitary subassembly, with the conductive shaft 30 being electrically connected to rotor electrode 25. It should be noted that the shaft 30 has a tool-receiving slot 32, and that the bottom of shaft 30 has an outwardly deformable section 33, which shall be described hereinafter as being deformable in order to hold the capacitor assembled. It should also be noted that the soldering of shaft 30 to the rotor 23 takes place as a separate assembly so that the lower surface of the rotor 23 in FIG. 5 can be easily cleaned of any soldering flux or contamination created during the soldering operation. This becomes important in the subsequent assembly of the capacitor since this surface is to be lubricated and must slide easily over the top surface of the stator. Moreover, any contamination of these surfaces will cause a considerable reduction in capacitance as well as unstability due to the consequent air gaps.

The stator structure is shown particularly in FIGS. 1, 6 and 7 as the stator 40 and consists of a suitable ceramic body 41 having the top thereof coated with a stator electrode 42, which may have a semicircular shape, as best seen in FIGS. 1 and 6.

In accordance with one aspect of the invention, the electrode coating 42 extends down along the side edge of the ceramic body 41, indicated particularly in FIGS. 1, 7 and 10 as edge portion 43. In accordance with a further aspect of the invention, a conductive pad coating 44 is disposed opposite the stator coating 42 and is arranged to have exactly the same height above the top of the dielectric disk 41 as the coating 42, both coating surfaces forming a perfect plane. The pad 44 serves the purpose of preventing any tilting action of the rotor on the semicircular stator electrode 42. Such a tilting action would create an air gap between the bottom of the dielectric material 24 of the rotor of FIG. 5 and the top of the stator electrode coating 42 of FIG. 7. The pad is also provided with a downwardly extending portion 45, shown in FIGS. 1, 7 and 10, which allows mechanical support of the stator by soldering extension 45 to the mating pattern of the printed circuit board.

It should be noted that the top edge of the stator disk 41 can be chamfered at the regions where the electrode extension 43 is to be received to insure electrical continuity between the stator coating (electrode) 42 and edge portion 43. The normally sharp edge of the lapped stator top surface may interrupt such coatings.

In accordance with an important feature of the invention, the stator 40 of FIGS. 6 and 7 is first soldered in place on the printed circuit board before any assembly with the rotor 23. Thus, as shown in FIGS. 8 and 9, the stator itself is laid atop the printed circuit board, with edge portion 43 of the main stator electrode 42 being aligned over the conductive region 21 which is to be connected to the stator 40. In addition, the stator electrode 42 is aligned on the center of an opening 50, shown in FIGS. 1, 9 and 10 which, in accordance with another aspect of the invention, will receive a portion of the mechanism which holds assembled the trimmer capacitor.

As shown in FIG. 1, a further conductive pad 52 may be placed on the surface of the printed circuit board 20, where the pad 52, shown also in FIGS. 8 and 10, supports one end of stator 40, such that the stator spans the space between conductive coatings 21 and 52. The extensions 43 and 45 of stator electrode 42 and pad 44 are then appropriately soldered to circuit patterns 21 and 52, respectively, as shown in FIGS. 8 and 9.

An important feature of the invention is that this soldering operation takes place before the rotor and stator have been assembled. Accordingly, all soldering fluxes and contaminations created during the soldering operation can be washed away after the soldering operation so that the upper exposed surface of stator 40 can be lubricated and perfectly mated with the cooperating rotor surface without having this lubricant subjected to heat and preventing surface contamination during the soldering operation. Note that these opposing surfaces have been polished smooth and flat and should not be flux contaminated since this might cause "freezing" of the rotor to the stator. Such flux or flux vapors can penetrate said interface through capillary action.

Before assembly of the stator to the printed circuit board, a lug 60, having a general Z shape and shown in FIGS. 1, 9 and 10, is soldered to the board. Thus, the lug 60 is fit through opening 50 and its lower leg bears against conductive coating 22, which is to be connected to the rotor electrode of the trimmer capacitor. The end of lug 60 is then soldered to coating 22, as indicated by the solder mass 61 in FIGS. 9 and 10, before the stator or rotor are in position on the printed circuit board. Thus, again, soldering fluxes, and products of the vapors thereof, may be washed away before the assembly of the stator and rotor. Note that the lug 60 is in position on the printed circuit board when the stator 40 is soldered thereto in FIGS. 8 and 9.

In order to complete the assembly of the device and as shown in FIG. 1 and 10, the rotor 23, with its secured adjustment shaft 30, is placed atop the stator 40, with the shaft 30 extending through the central opening in the stator 40, and through the opening 50 in the printed circuit board 20. Note that the shaft 30 extends through a central opening 60*a* in the lug 60, as shown in FIGS. 1 and 10. The bowed spring washer 70 is then placed over the end of shaft 30 and bears against the bottom of pad 60, and a flat washer 71 is placed behind the spring washer 70. The bottom end of shaft 30 then has its hollow end spread outwardly by a suitable pressure applying tool so that its end curls into the bottom surface of washer 71, forcing the washer 71 into pressure engagement with bowed spring washer 70. The bowed spring washer 70, in turn, exerts a downward force on shaft 30, thereby rigidly to hold the bottom surface of rotor 23 flush against the top surface of stator coating 42 of the stator 40. Spring washer 70 also bears against the flat portion of lug 60, therefore assuring electrical continuity between the rotor electrode and printed circuit board 20 via shaft 30, washer 71, bowed washer 70. Note that prior to this assembly, the cooperating surfaces of stator 40 and rotor 23 may have a thin film of a suitable lubricant applied therebetween. Thus, as shaft 30 is rotated, the entire rotor 23 will rotate with the shaft 30 and relative to the fixed stator 40. The use of the lubricant insures against any wear or galling between the relatively rotatable components.

In accordance with a principle of the invention, the total height of the trimmer capacitor above the upper surface of board 20 in FIG. 10 is at a minimum since the lower end of shaft 30, along with its washers 70 and 71, are disposed within the opening 50 of the printed circuit board 20. Thus, the overall height of the trimmer capacitor above the top surface of board 20 is reduced by about the thickness of the board 20. A further reduction of said height stems from the elimination of stator connectors previously required for stator lug securing. In accordance with further aspects of the invention, the method of assembly has insured against the danger of contaminating and/or deteriorating the lubricant between the rotor and stator assemblies as well as contaminating the rotor/stator interface due to the need for soldering and soldering fluxes after these two surfaces engage one another.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. In combination, a printed circuit board, a trimmer capacitor;

said printed circuit board comprising a generally flat, elongated insulation board having a first conductive region on a first surface thereof; said printed circuit board having an opening therethrough;

said trimmer capacitor comprising a stator body, a rotor body, and adjustment shaft, and lug means for making electrical connection from said rotor body;

said stator body comprising a first flat body of dielectric material and a flat, elongated stator electrode supported by said first flat body at a surface adjacent one side of said first body; the opposite side of said first body being mechanically secured to said first surface of said printed circuit board and extending across said opening in said printed circuit board; said stator electrode being electrically connected to said first conductive region;

said rotor body comprising a second flat body of dielectric material, disposed adjacent said one side of said first body and a flat, elongated rotor electrode supported by said second flat body in a plane generally parallel to the plane of said stator electrode; said rotor body being rotatable relative to said stator body; said stator and rotor electrodes being shaped to present a different overlapping area with rotation of said rotor body in order to vary the capacitance defined by said stator and rotor electrodes;

said adjustment shaft comprising an elongated conductive shaft disposed perpendicular to said first and second flat bodies extending through aligned central openings in said first and second flat bodies and extending into said opening in said printed circuit board; one end of said adjustment shaft being mechanically connected to said rotor body and being electrically connected to said rotor electrode; the other end of said adjustment shaft being disposed within said opening in said printed circuit board and being connected to said opposite side of said first body, thereby to press said first and second bodies toward one another;

said lug means comprising a conductive lug connected to said adjustment shaft.

2. The combination of claim 1 which includes spring means disposed within said opening in said printed circuit board and connected between said other end of said shaft and said first body.

3. The combination of claim 1 wherein said conductive lug is disposed at least partly within said opening in said printed circuit board; said conductive lug having a disk-shaped body portion disposed around said adjustment shaft and in electrical contact therewith; said printed circuit board having a second conductive region on the surface thereof opposite to said first surface; said conductive lug having an extending section extending from out of said opening in said printed circuit board and into contact with said second conductive region.

4. The combination of claim 3 which includes spring means disposed within said opening in said printed circuit board and connected between said other end of said shaft and said first body; said disk-shaped body portion of said lug means being disposed between said first body and said spring means.

5. The combination of claim 1 wherein said rotor electrode is embedded in said second body, and wherein said stator electrode is deposited on the top of said one side of said first body, whereby said stator and rotor electrodes are spaced from one another by the thickness of the dielectric of said second body from said rotor electrode to the exterior side of said second body adjacent said first body; and lubrication means for lubricating the engaging surfaces of said first and second bodies.

6. The combination of claim 1 wherein said stator electrode has an axially extending portion extending along a side edge of said first body; said axially extending portion being soldered to said first conductive region.

7. The combination of claim 1 wherein said stator electrode has an axially extending portion extending along a side edge of said first body; said axially extending portion being soldered to said first conductive region; and wherein said stator further contains a conductive pad on said one side; said pad being spaced from said stator electrode and defining a continuous surface with said stator electrode for the support of said rotor body; said conductive pad having an axially extending portion extending along a side edge of said first body; said axially extending portion of said pad being soldered to said first surface of said printed circuit board.

8. The combination of claim 3 wherein said rotor electrode is embedded in said second body, and wherein said stator electrode is deposited on the top of said one side of said first body, whereby said stator and rotor electrodes are spaced from one another by the thickness of the dielectric of said second body from said rotor electrode to the exterior side of said second body adjacent said first body; and lubrication means for lubricating the engaging surfaces of said first and second bodies.

9. The combination of claim 3 wherein said stator electrode has an axially extending portion extending along a side edge of said first body; said axially extending portion being soldered to said first conductive region.

10. The combination of claim 9 wherein said stator further contains a conductive pad having an axially extending portion extending along a side edge of said first body; said axially extending portion being soldered to a second conductive region of said printed circuit board.

11. The method of manufacture of a trimmer capacitor comprising the steps of:

forming an opening in a support insulation panel;

inserting a connection lug within said opening and soldering an extension thereof to one surface of said panel, and thereafter cleaning said panel and lug of soldering flux;

attaching a dielectric stator body to the opposite surface of said panel by soldering from said opposite surface to a conductive stator electrode on said stator body, and thereafter cleaning said panel and stator body of soldering flux;

lubricating the upper surface of said stator body;

and mechanically connecting a rotor body and an adjustment shaft connected thereto to said stator body by connecting one end of said shaft to said connection lug, with one surface of said rotor body in rotatable engagement with said upper surface of said stator body, whereby soldering flux due to the soldering to said lug and said stator electrode does not effect the properties of the lubricant between said rotor and stator bodies.

* * * * *